US006701468B1

(12) United States Patent
Yamazaki et al.

(10) Patent No.: US 6,701,468 B1
(45) Date of Patent: Mar. 2, 2004

(54) CODE ERROR CORRECTING CIRCUIT, CODE ERROR CORRECTING METHOD, COMMUNICATING APPARATUS AND COMMUNICATING METHOD

(75) Inventors: Osamu Yamazaki, Tsurugashima (JP); Takehiko Shioda, Tsurugashima (JP); Masami Suzuki, Tsurugashima (JP); Manabu Nohara, Tsurugashima (JP); Yasuteru Kodama, Tsurugashima (JP); Satoshi Odagawa, Tsurugashima (JP); Masahiro Okamura, Tsurugashima (JP); Takayuki Akimoto, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 294 days.

(21) Appl. No.: 09/657,805

(22) Filed: Sep. 8, 2000

(30) Foreign Application Priority Data

Sep. 10, 1999 (JP) ............................................. 11-256960

(51) Int. Cl.[7] ............................................... G11C 29/00
(52) U.S. Cl. .......................... 714/702; 714/718; 714/763
(58) Field of Search ................................. 714/702, 718, 714/763

(56) References Cited

U.S. PATENT DOCUMENTS

| 5,587,807 A | * | 12/1996 | Ootsuka et al. | 386/46 |
| 5,818,789 A | * | 10/1998 | Yung et al. | 365/230.06 |
| 5,886,998 A | * | 3/1999 | Voith et al. | 714/702 |
| 5,898,611 A | * | 4/1999 | Yamada | 365/154 |
| 5,901,152 A | * | 5/1999 | Tanaka et al. | 714/718 |
| 5,912,898 A | * | 6/1999 | Khoury | 714/701 |
| 5,928,371 A | * | 7/1999 | Robinson et al. | 714/702 |
| 5,968,200 A | * | 10/1999 | Amrany | 714/786 |
| 6,014,761 A | * | 1/2000 | Lachish et al. | 714/702 |
| 6,088,291 A | * | 7/2000 | Fujioka et al. | 365/233 |
| 6,122,193 A | * | 9/2000 | Shibata et al. | 365/185.03 |
| 6,147,915 A | * | 11/2000 | Yanagisawa et al. | 365/194 |
| 6,178,530 B1 | * | 1/2001 | Aman et al. | 714/702 |
| 6,181,660 B1 | * | 1/2001 | Hirayama et al. | 369/59.1 |
| 6,353,900 B1 | * | 3/2002 | Sindhushayana et al. | 714/701 |

* cited by examiner

Primary Examiner—Phung M. Chung
Assistant Examiner—Esaw T Abraham
(74) Attorney, Agent, or Firm—Morgan, Lewis & Bockius LLP

(57) ABSTRACT

A code error correcting circuit interleaves original data comprising a sequence of bit data having a length of p bits by arranging the bit data of the original data into a hypothetical matrix of I rows and J columns and then selecting the bit data positioned on the $i^{th}$ row along an order of the $j^{th}$ column. The circuit is provided with a memory unit having a plurality of memory areas each having a length of $2^n$ bits; and a controller for storing the original data to be interleaved into the memory areas respectively. The bit data, which are indicated by a bit select data, stored in the memory unit are sequentially outputted along an order of the $i^{th}$ row and the $j^{th}$ column in the hypothetical matrix as the interleaved original data.

6 Claims, 9 Drawing Sheets

FIG. 4

| | | | | | ROW: |
|---|---|---|---|---|---|
| $C_0$ | $C_1$ | $C_2$ | $C_3$ | $C_4$ | $i=0$ |
| $C_5$ | $C_6$ | $C_7$ | $C_8$ | $C_9$ | 1 |
| $C_{10}$ | $C_{11}$ | $C_{12}$ | $C_{13}$ | $C_{14}$ | 2 |
| $C_{15}$ | $C_{16}$ | $C_{17}$ | $C_{18}$ | $C_{19}$ | 3 |
| ⋮ | ⋮ | ⋮ | ⋮ | ⋮ | ⋮ |
| ⋮ | ⋮ | ⋮ | ⋮ | $C_{P-1}$ | |

READING OUT ↓

COLUMN: $j=0$, 1, 2, 3, 4

FIG. 5

| | MSB | | | | | | | LSB | |
|---|---|---|---|---|---|---|---|---|---|
| r=0 | $A_{0,7}=C_0$ | $A_{0,6}=C_1$ | $A_{0,5}=C_2$ | $A_{0,4}=C_3$ | $A_{0,3}=C_4$ | $A_{0,2}=C_5$ | $A_{0,1}=C_6$ | $A_{0,0}=C_7$ | ← $D_0$ |
| 1 | $A_{1,7}=C_8$ | $A_{1,6}=C_9$ | $A_{1,5}=C_{10}$ | $A_{1,4}=C_{11}$ | $A_{1,3}=C_{12}$ | $A_{1,2}=C_{13}$ | $A_{1,1}=C_{14}$ | $A_{1,0}=C_{15}$ | ← $D_1$ |
| 2 | $A_{2,7}=C_{16}$ | $A_{2,6}=C_{17}$ | $A_{2,5}=C_{18}$ | $A_{2,4}=C_{19}$ | $A_{2,3}=C_{20}$ | $A_{2,2}=C_{21}$ | $A_{2,1}=C_{22}$ | $A_{2,0}=C_{23}$ | ← $D_2$ |
| 3 | $A_{3,7}=C_{24}$ | $A_{3,6}=C_{25}$ | $A_{3,5}=C_{26}$ | $A_{3,4}=C_{27}$ | $A_{3,3}=C_{28}$ | $A_{3,2}=C_{29}$ | $A_{3,1}=C_{30}$ | $A_{3,0}=C_{31}$ | ← $D_3$ |
| 4 | $A_{4,7}=C_{P-6}$ | $A_{4,6}=C_{P-5}$ | $A_{4,5}=C_{P-4}$ | $A_{4,4}=C_{P-3}$ | $A_{4,3}=C_{P-2}$ | $A_{4,2}=C_{P-1}$ | Don't Care | Don't Care | ← $D_4$ |
| ⋮ | | | | | | | | | |
| R−1 | | | | | | | | | |

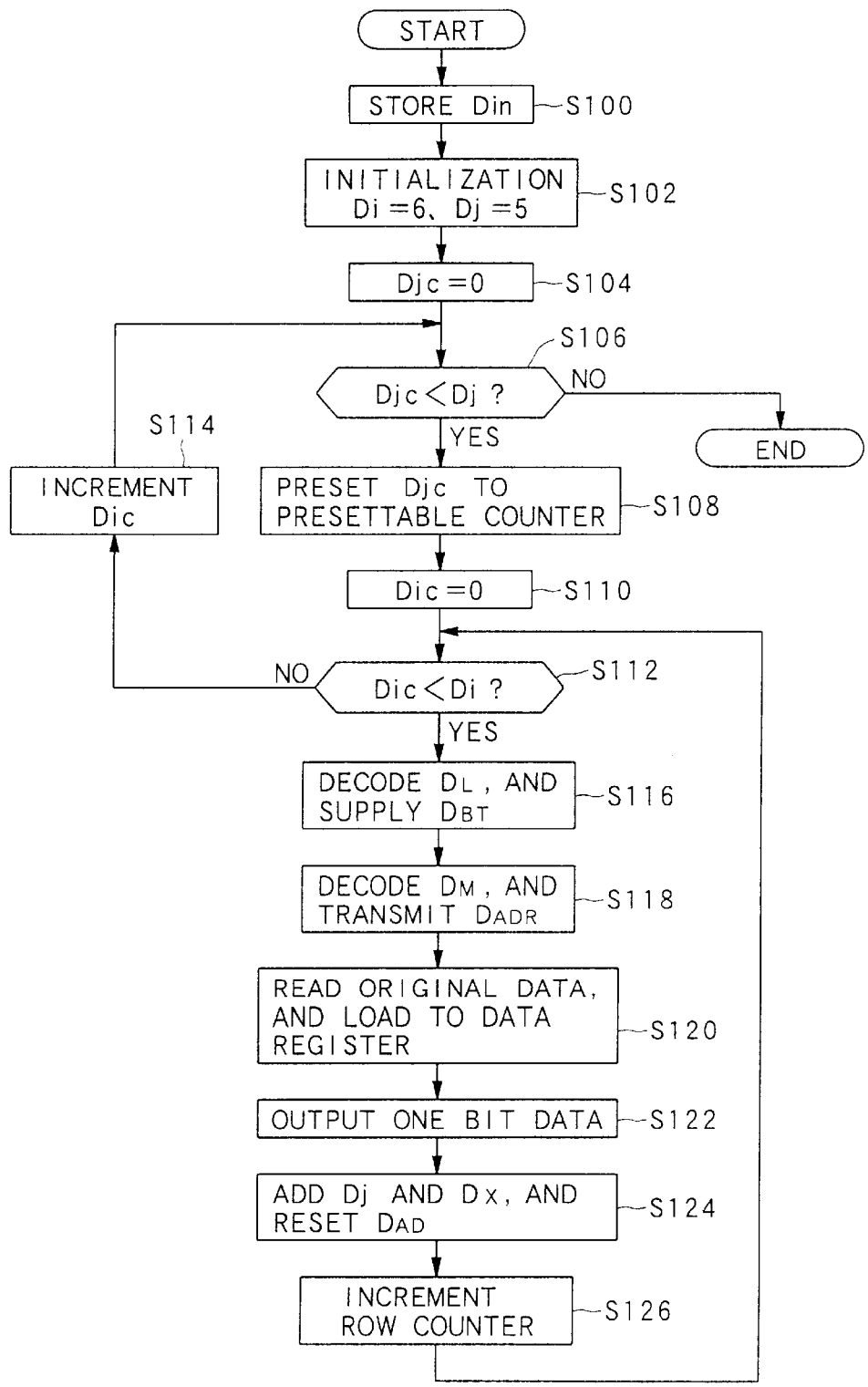

FIG. 8A

| STEP | Dx | DADR | DBT | DLD | Dout | Dic | Djc | Di | Dj |
|---|---|---|---|---|---|---|---|---|---|
| S102 | | | | | | | | | 5 |
| S104 | | | | | | | | 6 | |
| S106 | | | | | | | | | |
| S108 | 0 | | | | | | | | |
| S110 | | | | | | | | | |
| S112 | | | | | | | 0 | | |
| S114 | | | | | | 0 | | | |
| S116 | | | 0 | | | | | | |
| S118 | | 0 | | | | | | | |
| S120 | | | | {01011010} | | | | | |
| S122 | | | | | "0" | | | | |
| S124 | 5=0+5 | | | | | | | | |
| S126 | | | | | | 1=1+0 | | | |

FIG. 8B

| STEP | Dx | DADR | DBT | DLD | Dout | Dic | Djc | Di | Dj |
|---|---|---|---|---|---|---|---|---|---|
| S116 | 5 | | 5 | | | | | 6 | 5 |
| S118 | | 0 | | | | | | | |
| S120 | | | | {01011010} | | | | | |
| S122 | | | | | "0" | | | | |
| S124 | 10=5+5 | | | | | | | | |
| S126 | | | | | | 2=1+1 | | | |

CODE ERROR CORRECTING CIRCUIT, CODE ERROR CORRECTING METHOD, COMMUNICATING APPARATUS AND COMMUNICATING METHOD

BACKGROUND OF THE INVENTION

1. Field of the Invention

The present invention relates to a code error correcting circuit for and a code error correcting method of interleaving the digital data. The present invention also relates to a communicating apparatus and a communicating method, which respectively include the code error correcting circuit and the code error correcting method.

2. Description of the Related Art

As a code error correcting technique for digital data, an interleave is performed. In the technical field of information communication, the bit arrangements of original data to be transmitted are permuted under a predetermined rule (i.e., interleaved) and the original data is transmitted at a transmitting side. Then, the original data is obtained or recovered by de-interleaving the received data under the predetermined rule at a receiving side. As the information communication is performed by using such an interleave, even if code errors are generated in the data by the influence of noises etc., the spots of the code errors are dispersed at the time of interleaving. Therefore, the spots of the code errors can be easily corrected, so that the communication quality can be improved.

Further, the interleave is utilized in not only the field of information communication but also the field of digital information process widely. As one example, the interleave is utilized at the time of recording data onto an information record medium such as a DVD or the like.

In order to perform the interleave, a semiconductor memory is prepared, which is accessible by a width of one bit. The data, in which the bit arrangements are permuted, are generated by writing respective bit data of the original data to a plurality of bits provided in the semiconductor memory and then reading out the written data one bit by one bit while memory-accessing in accordance with a predetermined order. The writing control to write the original data one bit by one bit into the semiconductor memory and the reading control to read out the written data one bit by one bit are performed by a microprocessor or a CPU (Central Processing Unit).

However, if the bit arrangements of the original data are permuted by using the above mentioned semiconductor memory which is memory-accessible by the one bit width, the number of times of memory-accessing for writing and reading the data into and from the semiconductor memory is certainly increased. Thus, there is a problem that a processing time duration required for interleaving becomes long and an enormous process burden is applied onto the microprocessor.

In an electronic apparatus such as a communicating apparatus, an information processing apparatus or the like which is provided with a microprocessor to operate, the data to be processed are treated as data of $2^n$ (n: natural number) bits e.g., 8 bits, 16 bits, 32 bits and so on. Thus, as the working memory of the microprocessor, the semiconductor memory for storing the data of $2^n$ bits in correspondence with respective addresses is used in general. Therefore, if the working memory is used at the time of interleaving, the resources equipped in the electronic apparatus may be efficiently utilized, and it may be convenient for the process of interleaving by the microprocessor.

However, in case that the interleave by the microprocessor is to be performed by using the above mentioned working memory, the original data are stored one bit by one bit into the respective memory areas of the working memory, and the stored data are read out one bit by one bit from the respective memory areas in accordance with the predetermined order. Thus, although the data of $2^n$ bits can be stored in each memory area, only one bit is actually stored in each memory area, which causes a problem that the working memory cannot be efficiently utilized.

Furthermore, in case of using the above mentioned working memory, processes are repeated in which the bit data is stored as memory-accessing is performed by the unit of one bit to the respective memory areas and then the bit data is read out as memory-accessing is performed again by the unit of one bit to the respective memory areas in accordance with the predetermined order. Thus, in the same manner as using the conventional semiconductor memory accessible by the width of one bit, the number of times of memory-accessing is certainly large, so that the burden on the microprocessor becomes heavy and the processing time duration required for interleaving cannot be actually shortened, which is a problem.

SUMMARY OF THE INVENTION

It is therefore an object of the present invention to provide a code error correcting circuit and a code error correcting method, which can perform interleaving at a high speed, by using of a memory device having a plurality of memory areas each storing data of $2^n$ bits in association with each address, and which are suitable for interleaving under a control of a microprocessor, as well as a communicating apparatus and a communicating method, which respectively include the code error correcting circuit and the code error correcting method.

The above object of the present invention can be achieved by a code error correcting circuit for interleaving original data comprising a sequence of bit data having a length of p bits (p: natural number) by arranging the bit data of the original data into a hypothetical matrix of I (I: natural number not less than 2) rows and J (J: natural number not less than 2) columns and then selecting the bit data positioned on the $i^{th}$ (i: natural number, $1 \leq i \leq I$) row along an order of the $j^{th}$ (j: natural number, $1 \leq j \leq J$) column. The code error correcting circuit is provided with: a memory unit having a plurality of memory areas each having a length of $2^n$ bits (n: natural number); a controller for storing the original data to be interleaved into the memory areas respectively; a first data generating device for generating a first data indicating a position of the $i^{th}$ row in the hypothetical matrix; a second data generating device for generating a second data indicating a position of the $j^{th}$ column in the hypothetical matrix; an address decoding device for generating address data indicating one of the memory areas, in which the bit data positioned on the $j^{th}$ column are stored, on the basis of the first data and the second data; and a select data decoding device for generating a bit select data indicating the bit data positioned on the $i^{th}$ row among the bit data stored in said one of the memory areas, which is indicated by the address data, on the basis of the first data and the second data. The controller controls the first data generating device, the second data generating device, the address decoding device and the select data decoding device so that the bit data, which are indicated by the bit select data, stored in the memory unit are sequentially outputted along an order of the $i^{th}$ row and the $j^{th}$ column in the hypothetical matrix as the interleaved original data.

According to the code error correcting circuit of the present invention, it is possible to interleave the original data by using the memory unit having the memory areas each having the length of $2^n$ bits such as 8 bits, 16 bits, 32 bits and so on. Thus, it is possible to realize the code error correcting circuit suitable for a microcomputer system. Further, it is possible to reduce the number of times of memory-accessing the memory unit in case of employing the microprocessor. By this, it is possible to reduce the burden on the microprocessor while shortening the processing time duration required for interleaving.

In one aspect of the code error correcting circuit of the present invention, the code error correcting circuit is further provided with: a data holding device for holding the sequence of the bit data having a length of $2^n$ bits, which are read out from the memory area corresponding to the address data; and a bit selecting device for selecting the bit data indicated by the bit select data from among the sequence of the bit data having the length of $2^n$ bits held by the data holding device, and outputting the selected bit data as the interleaved data.

The above object of the present invention can be also achieved by a code error correcting method of interleaving original data comprising a sequence of bit data having a length of p bits (p: natural number) by arranging the bit data of the original data into a hypothetical matrix of I (I: natural number not less than 2) rows and J (J: natural number not less than 2) columns and then selecting the bit data positioned on the $i^{th}$ (i: natural number, $1 \leq i \leq I$) row along an order of the $j^{th}$ (j: natural number, $1 \leq j \leq J$) column. The code error correcting method includes: a controlling process of storing the original data to be interleaved into a plurality of memory areas each having a length of $2^n$ bits (n: natural number) of a memory unit respectively; a first data generating process of generating a first data indicating a position of the $i^{th}$ row in the hypothetical matrix; a second data generating process of generating a second data indicating a position of the $j^{th}$ column in the hypothetical matrix; an address decoding process of generating address data indicating one of the memory areas, in which the bit data positioned on the $j^{th}$ column are stored, on the basis of the first data and the second data; a select data decoding process of generating a bit select data indicating the bit data positioned on the $i^{th}$ row among the bit data stored in said one of the memory areas, which is indicated by the address data, on the basis of the first data and the second data; and an outputting process of outputting the bit data, which are indicated by the bit select data, stored in the memory unit sequentially along an order of the $i^{th}$ row and the $j^{th}$ column in the hypothetical matrix as the interleaved original data.

According to the code error correcting method of the present invention, it is possible to interleave the original data by using the memory unit having the memory areas each having the length of $2^n$ bits such as 8 bits, 16 bits, 32 bits and so on. Thus, it is possible to realize the code error correcting circuit suitable for a microcomputer system. Further, it is possible to reduce the number of times of memory-accessing the memory unit in case of employing the microprocessor. By this, it is possible to reduce the burden on the microprocessor while shortening the processing time duration required for interleaving.

In one aspect of the code error correcting method of the present invention, the code error correcting method further includes: a data holding process of holding the sequence of the bit data having a length of $2^n$ bits, which are read out from the memory area corresponding to the address data; and a bit selecting process of selecting the bit data indicated by the bit select data from among the sequence of the bit data having the length of $2^n$ bits held by the data holding process, and outputting the selected bit data as the interleaved data.

The above object of the present invention can be also achieved by a communicating apparatus provided with (i) the above described code error correcting circuit of the present invention, and (ii) a transmitting device for transmitting the interleaved original data.

According to the communicating apparatus of the present invention, it is possible to interleave the original data by using the memory unit having the memory areas each having the length of $2^n$ bits. Thus, it is possible to realize the communicating apparatus suitable for a microcomputer system.

The above object of the present invention can be also achieved by a communicating method including (i) the above described code error correcting method of the present invention, and (ii) a transmitting process of transmitting the interleaved original data.

According to the communicating method of the present invention, it is possible to interleave the original data by using the memory unit having the memory areas each having the length of $2^n$ bits. Thus, it is possible to realize the communicating method suitable for a microcomputer system.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

FIG. 4 is a diagram for explaining an algorithm of interleaving in the embodiment;

FIG. 5 is a diagram showing such a condition of a memory unit that the original data are stored in the embodiment;

FIG. 7 is a flow chart showing an operation of the embodiment;

FIG. 8A is one diagram for explaining the operation of the embodiment;

FIG. 8B is another diagram for explaining the operation of the embodiment; and

DETAILED DESCRIPTION OF THE PREFERRED EMBODIMENTS

Figure 1:
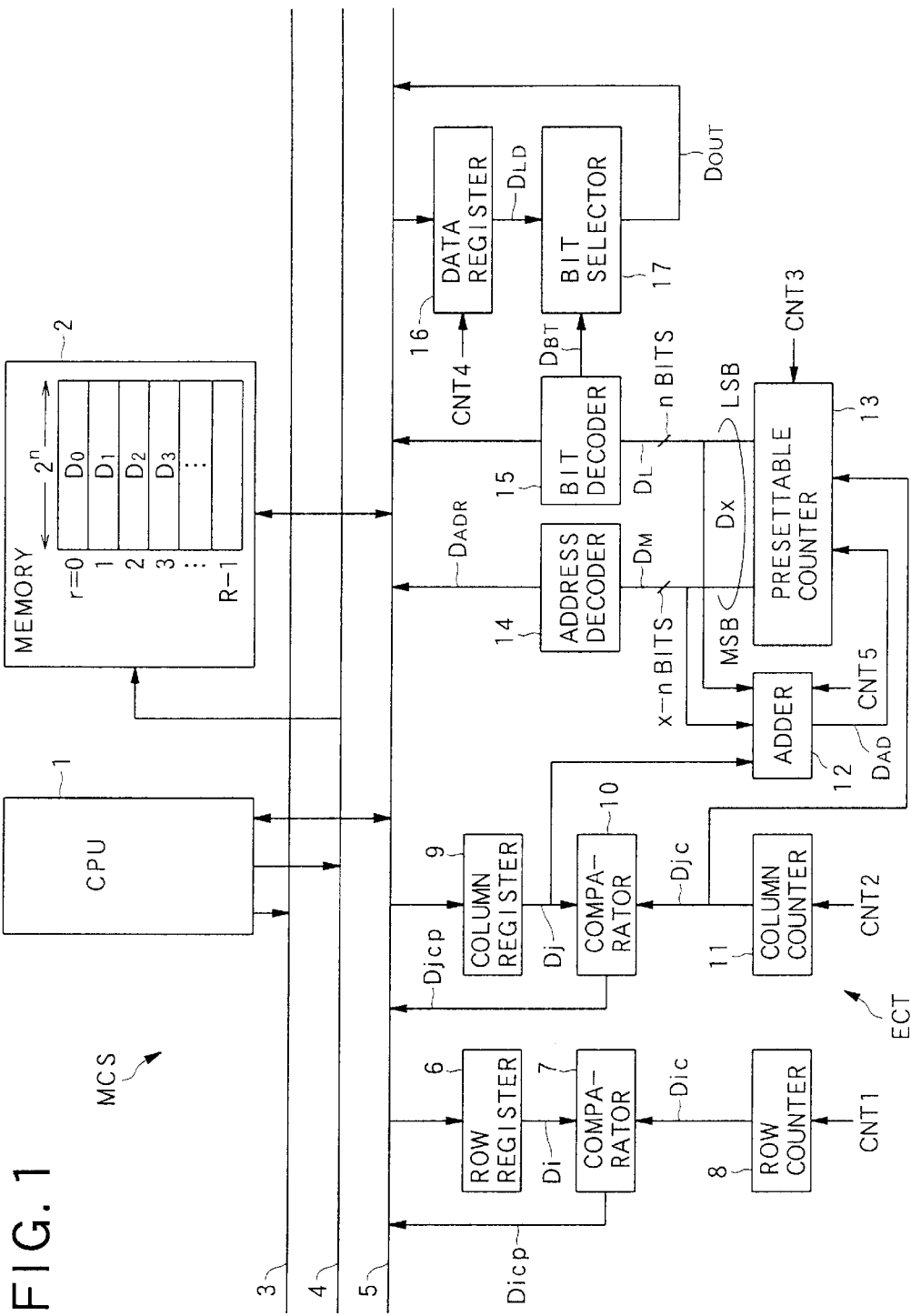
FIG. 1 is a block diagram showing a structure of a code error correcting circuit as an embodiment of the present invention.

Referring to the accompanying drawings, an embodiment of the present invention will be now explained. FIG. 1 is a block diagram showing a structure of a code error correcting circuit as the embodiment.

In FIG. 1, a code error correcting circuit ECT is provided in an electronic apparatus together with a microcomputer system MCS having a CPU (Central Processing Unit) 1 and a memory unit 2, and performs interleaving original data stored in the memory unit 2 in cooperation with the CPU 1.

The memory unit 2 having a plurality of memory areas D0 to DR−1 (R: natural number) corresponding to respective addresses r=0 to R−1. Each of the memory areas D0 to DR−1 is adapted to store the data in the bit length represented by $2^n$ (n: natural number) bits. For example, the memory unit 2 has a memory capacity for a plurality of words in a 8 bits/word structure, a 16 bits/word structure, 32 bits/word structure and so on, which is suitable for the CPU 1 to perform data-processing.

The code error correcting circuit ECT is provided with a row register 6, a comparator 7, a row counter 8, a column register 9, a comparator 10, a column counter 11, an adder 12, a presettable counter 13, an address decoder 14, a bit decoder 15, a data register 16 and a bit selector 17. Those elements are appropriately connected to a control bus 3, an address bus 4 and a data bus 5 of the microcomputer system MCS, and operate under a control of the CPU 1.

The row register 6 holds a row specifying data Di which is supplied from the CPU 1 through the data bus 5, and supplies the held row specifying data Di to the comparator 7.

The row counter 8 is a binary counter, and performs resetting and counting operations in accordance with a control signal CNT1 supplied from the CPU 1 through the control bus 3, and further supplies a row counted data Dic, which is generated by the resetting and counting operations, to the comparator 7.

The comparator 7 compares the values of the row specifying data Di and the row counted data Dic with each other, and transmits a row comparison data Dicp indicative of a comparison result, to the CPU 1 through the data bus 5.

The column register 9 holds a column specifying data Dj which is supplied from the CPU 1 through the data bus 5, and supplies the held column specifying data Dj to the comparator 10.

The column counter 11 is a binary counter, and performs resetting and counting operations in accordance with a control signal CNT2 supplied from the CPU 1 through the control bus 3, and further supplies a column counted data Djc, which is generated by the resetting and counting operations, to the comparator 10.

The comparator 10 compares the values of the column specifying data Dj and the column counted data Djc with each other, and transmits a column comparison data Djcp indicative of a comparison result, to the CPU 1 through the data bus 5.

The presettable counter 13 is a binary counter of parallel input and parallel output type. The presettable counter 13 presets the column counted data Djc in the column counter 11 or an addition data Dad in the adder 12, in accordance with a control signal CNT3 supplied from the CPU 1 through the control bus 3. The presettable counter 13 increments the preset column counted data Djc or the preset addition data Dad in accordance with the control signal CNT3.

Incidentally, supposing that the one block length of the original data Din to be interleaved is p bits, a binary counter having x bits length, which satisfies a following expression (1), is used as the presettable counter 13 from a relationship with the bit length of $2^n$ bits of each of the memory areas D0 to DR−1.

$$2^{x-1} < p \leq 2^x \qquad (1)$$

For example, supposing that the one block length of the original data Din is p=30 bits and the bit length of each of the memory areas D0 to DR−1 is $2^n$=8 bits (i.e., n=3), a binary counter having the bit length x=5 bits is used as the presettable counter 13 from the conditions expressed by the expression (1) since $2^4 < 30 \leq 2^5$.

Alternatively, for example, supposing that the one block length of the original data Din is p=48 bits and the bit length of each of the memory areas D0 to DR−1 is $2^n$=16 bits (i.e., n=4), a binary counter having the bit length x=6 bits is used as the presettable counter 13 from the conditions expressed by the expression (1) since $2^5 < 48 \leq 2^6$.

The adder 12 digitally adds the column specifying data Dj, which is outputted from the column register 9, and the counted data Dx having the x bits length, which is outputted from the presettable counter 13, in accordance with a control data CNT5, which is supplied from the CPU 1 through the control bus 3, to thereby output the addition data Dad (=Dj+Dx).

The address decoder 14 binary-decodes x−n bits of binary data DM from the side of the MSB (Most Significant Bit) among the counted data Dx having the x bits length, which is outputted from the presettable counter 13, and transmits address data DADR indicative of the result of decoding, to the CPU 1 through the data bus 5.

The bit decoder 15 binary-decodes n bits of binary data DL from the side of the LSB (Least Significant Bit) among the counted data Dx having the x bits length, which is outputted from the presettable counter 13, and transmits select data DBT indicative of the result of decoding, to the bit selector 17.

The data register 16 is a binary register of parallel input and parallel output type. The memory capacity of the data register 16 is set to the bit length of $2^n$ bits same as each data (i.e., the data to be interleaved) stored in each of the memory areas D0 to DR−1 of the memory unit 2. Although the detail thereof will be described later, when a control signal CNT4 is supplied to the data register 16 from the CPU 1 through the control bus 3, the data register 16 inputs or loads the data read out from the memory unit 2 (i.e., the data to be interleaved) through the data bus 5, and outputs the data DLD in parallel to the bit selector 17 while holding the data DLD.

The bit selector 17 is constituted by a multiplexer, and selects and outputs only the output data Dout of one bit, which is specified by the select data DBT, among the data DLD which are supplied from the data register 16.

Figure 2:
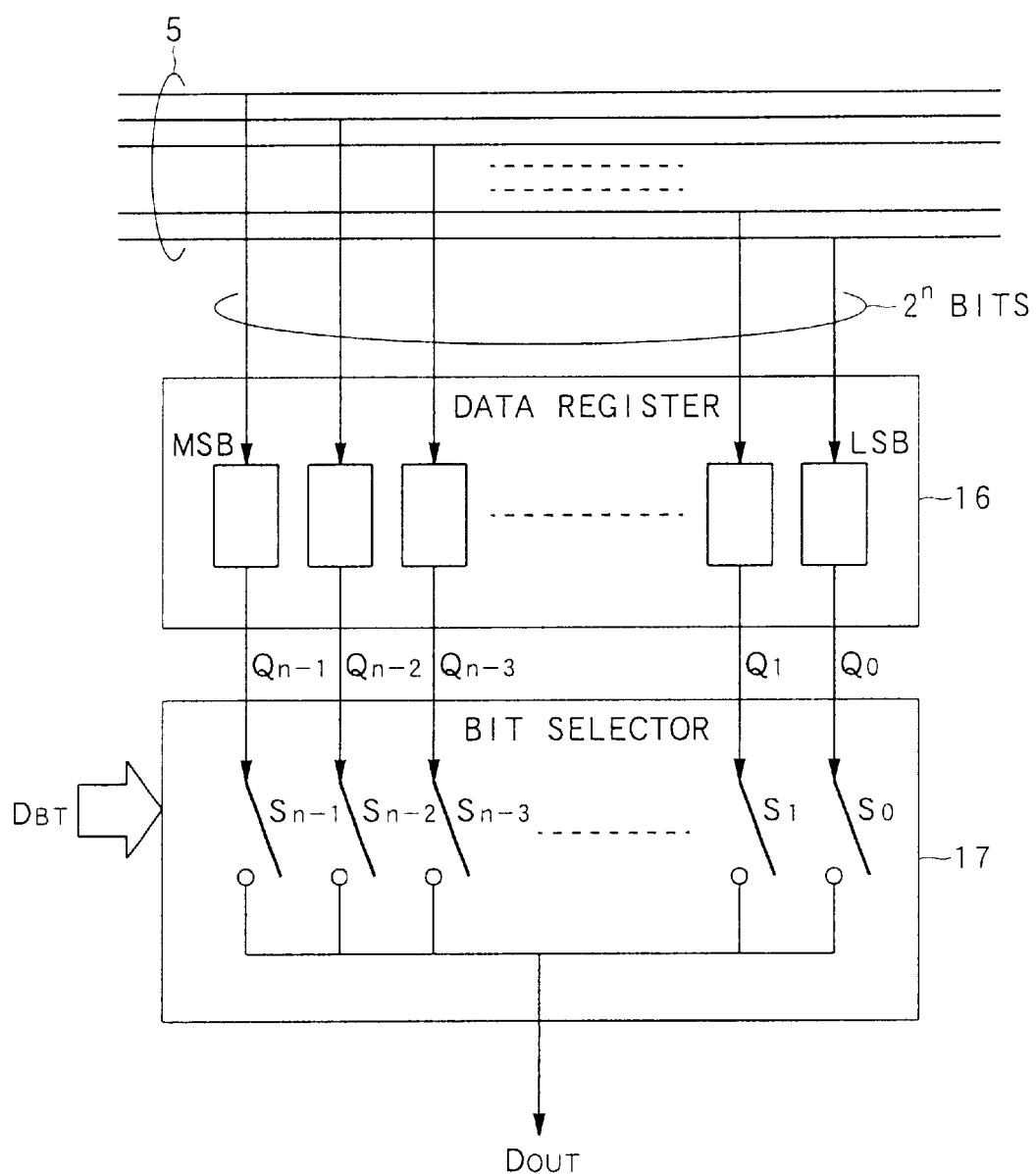
FIG. 2 is a block diagram showing a structure of a bit selector provided in the code error correcting circuit.

More concretely, as shown in FIG. 2, the bit selector 17 has a plurality of switching elements S0 to Sn−1 respectively connected in parallel to output terminals Q0 to Qn−1 in an amount corresponding to $2^n$ bits in the data register 16. The open/close control of the respective switching elements S0 to Sn−1 are performed by the select data DBT. The switching elements S0 to Sn−1 are constructed such that either one of them is exclusively closed by the select data DBT. Then, the bit selector 17 outputs the output data Dout as the interleaved data and transmits it to the side of the micro computer system MCS through the data bus 5.

When the values of the binary data DL at the lower n bits amount outputted from the presettable counter 13 are "0", only the switching element Sn−1 at the MSB is closed by the select data DBT. Each time when the binary data DL is incremented by "1", the switching element is exclusively closed in the order of Sn−2, Sn−3, Sn−4 . . . , S1, S0 by the select data DBT.

In the present embodiment, although the bit selector 17 is constituted by a multiplexer, it may be constituted such that a shift register for bit-shifting the data DLD of the data register 16 in correspondence with the select data DBT is employed, and the bit data at the MSB as a result of bit-shifting by this shift register is selectively outputted as the output data Dout.

Next, the operational examples of the code error correcting circuit ECT having the above described construction will be explained with referring to FIG. 3 to FIG. 8B.

Figure 3:
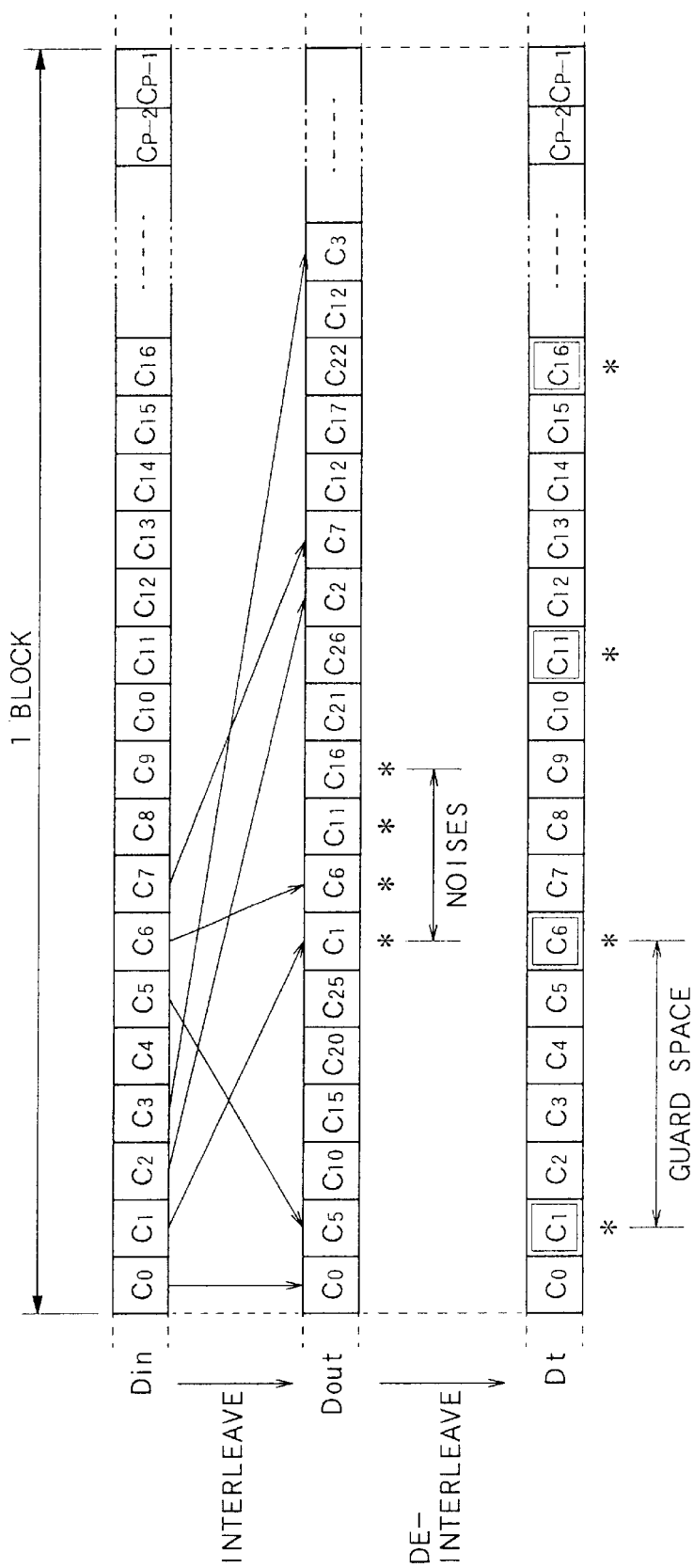
FIG. 3 is a diagram showing bit arrangements of original data, interleaved data and de-interleaved data in the embodiment.

For the sake of explanation, as shown in the upper stage of FIG. 3, it is assumed that the original data Din to be interleaved consists of a bit sequence of C0 to Cp−1 having p bits length per one block. Also, it is assumed that, by interleaving this original data Din, it is converted to the output data Dout having the bit arrangement as shown in the middle stage of FIG. 3.

Here, the algorithm is explained. As schematically shown in FIG. 4, after hypothetically arranging the bit sequence of C0 to Cp−1 into a matrix with dividing them by each 5 bits length for each row i, by (i) reading out the bit sequence of C0, C5, C10, C15, . . . , at the column j=0 in the order from the upper to the lower, (ii) then reading out the bit sequence of C1, C6, C11, C16, . . . , at the column j=1 in the order from the upper to the lower, (iii) then reading out the bit sequence of C2, C7, C12, C17, . . . , at the column j=2 in the order from the upper to the lower, . . . and so forth until reading out the final bit data Cp−1, the interleaving operation is performed.

Figure 6A:
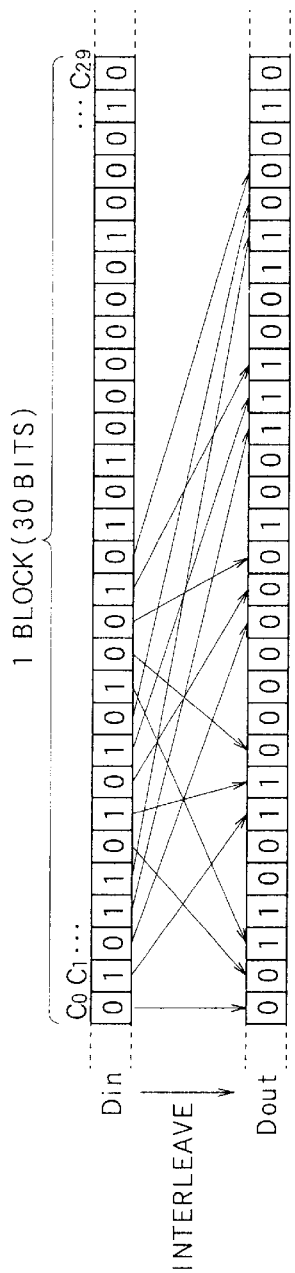
FIG. 6A is one diagram for explaining a case of interleaving the original data having 30 bits in one block in the embodiment.

Further, it is assumed that each of the recording areas D0 to DR−1 of the memory unit 2 has a 8 bits/word structure. In this case, the CPU 1 is as shown in FIG. 5, divides the original data Din by each 8 bits and then stores them into the respective memory areas D0, D1, D2, . . . , of the memory unit 2. Namely, the CPU 1 stores the original data Din by each 8 bits in such a manner as to store the bit data C0 to C7 into the respective bits $A_{0,7}$ to $A_{0,0}$ in the memory area D0, then store the bit data C8 to C15 into the respective bits $A_{1,7}$ to $A_{1,0}$ in the next memory area D1, then store the bit data C16 to C23 into the respective bits $A_{2,7}$ to $A_{2,0}$ in the further next memory area D2, and so forth. Also, if the p bits data C0 to Cp−1 cannot be divided by 8 bits, the CPU 1 does not care the bit or bits following the bit data Cp−1 finally stored Furthermore, for the sake of easy understanding, it is assumed that the original data Din is constituted by the bit sequence of C0 to C29 whose bit length is p=30 for each one block, and the respective bit data C0 to C29 have the values, as shown in FIG. 6A, {C0, C1, C2, C3, C4, C5, C6, C7, C8, C9, C10, C11, C12, C13, C14, C15, C16, C17, C18, C19, C20, C21, C22, C23, C24, C25, C26, C27, C28, C29}={0, 1, 0, 1, 1, 0, 1, 0, 1, 0, 1, 0, 0, 1, 0, 1, 0 1, 0, 0, 0, 0, 0, 0, 1, 0, 0, 0, 1, 0}.

Figure 6B:
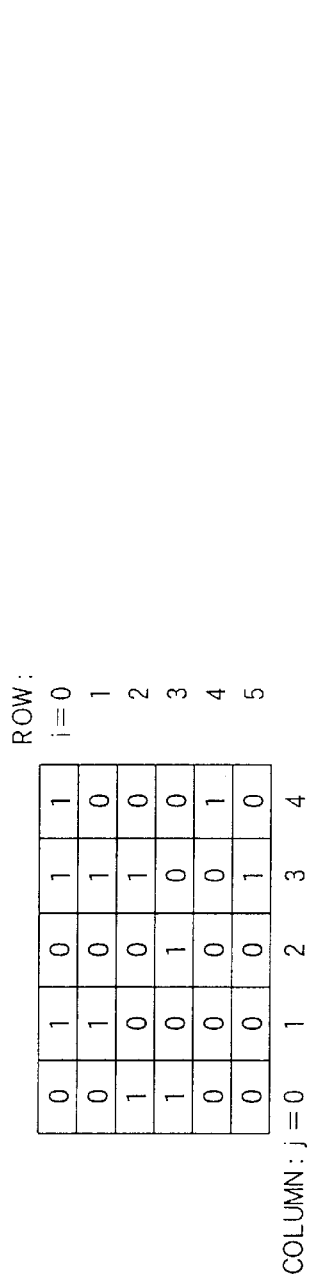
FIG. 6B is another diagram for explaining the case of interleaving the original data having 30 bits in one block in the embodiment.

As shown in the algorithm in FIG. 6B which corresponds to FIG. 4, by the same operation as arranging the bit sequence of C0 to Cp−1 into the matrix with dividing them by 5 bits length for each row i and then reading out them for each column j in the order from the upper to the lower, the interleaving process is performed. Also as shown in FIG. 6C which corresponds to FIG. 5, the CPU 1 stores the original data Din into the respective memory areas D0 to DR−1 each of which has the 8 bits/word structure, with dividing the original data Din by 8 bits length.

Next, the operation is explained with referring to the flowchart of FIG. 7.

Figure 6C:
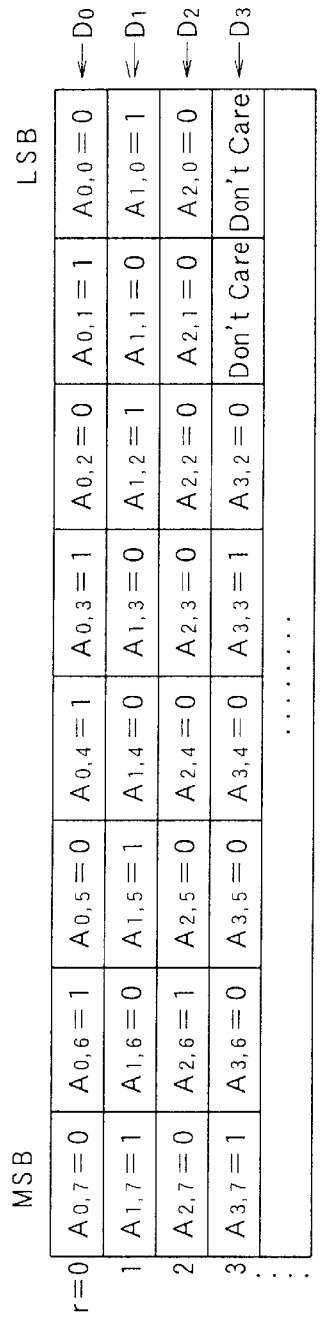
FIG. 6C is another diagram for explaining the case of interleaving the original data having 30 bits in one block in the embodiment.

At first, the CPU 1 stores the original data Din in the amount of one block into the memory unit 2 as shown in FIG. 6C (step S100).

Then, the row register 6 and the column register 9 are initialized such that the initial values are set to them respectively (step S102). Here, in correspondence with the algorithm shown in FIG. 6B, the initial value of the row register 6 is set to a binary value "6" indicative of the total number of rows i. Further, the initial value of the column register 9 is set to a binary value "5" indicative of the total number of columns j. By these, the initial row specifying data Di and the initial column specifying data Dj become as Di=6 and Dj=5, respectively.

Then, the column counter 11 is cleared (step S104). By this, the column counted data Djc of the column counter 11 becomes as Djc=0. In addition, the row counter 8, the presettable counter 13 and the data register 16 are also respectively reset.

In this manner, after the initialization processes are completed, the comparator 10 compares the column counted data Djc of the column counter 11 and the column specifying data Dj of the column register 9 with each other, and transmits the column comparison data Djcp indicative of the comparison result to the CPU 1. Then, the CPU 1 judges whether or not Djc<Dj on the basis of the column comparison data Djcp (Step S106). If Djc<Dj (step S106: YES), the operational flow proceeds to a step S108. On the other hand, if Djc≧Dj (step S106: NO), since the interleave is completed, the processes are ended.

At the step S108, the column counted data Djc of the column counter 11 is set (i.e., preset) to the presettable counter 13. Thus, when the process at the step S018 is firstly performed, it is preset as Djc=0 in the presettable counter 13 and the counted data Dx of the presettable counter 13 is also set as Dx=0.

Then, the row counter 8 is cleared (step S110). By this, the row counted data Djc becomes as Djc=0.

Then, the comparator 7 compares the row counted data Dic of the row counter 8 and the row specifying data Di of the row register 6 with each other, and transmits the row comparison data Dicp indicative of the comparison result to the CPU 1. Then, the CPU 1 judges whether or not Dic<Di on the basis of the row comparison data Dicp (Step S112). If Dic<Di (step S112: YES), the operational flow proceeds to a step S116. On the other hand, if Dic≧Di (step S112: NO), the operational flow branches to a step S114, where the column counted data Dic of the column counter 11 is incremented by "1", and then returns to the step S106 so as to repeat the processes from the step S106.

In this manner, when the processes at the steps S106 to S112 are completed, the counted data Dx of the presettable counter 13 indicates the order of the respective bit data sequence of the original data Din. The binary data DM of (x−n) bits from the MSB side among this counted data Dx becomes data indicative of the order of the rows of the bit data sequence shown in FIG. 6C, while the binary data DL of n=3 bits from the LSB side of this counted data Dx becomes data indicative of the order from the MSB on the above mentioned row shown in FIG. 6C. In the first processes at the steps S106 to S112, the row i=0 is selected by the binary data DL and the column j=0 is selected by the binary data DM. Also, after the process at the step S114 is performed, and then the processes at the steps S106 to S112 are repeated, since the column counted data Djc of the column counter 11 is incremented by "1", the column j shown in FIG. 6C is selected in the order of 1→2→3→4 by the binary data DM. On the other hand, as for the row i, since the row counted data Dic is cleared at the step S110, the row i=0 is selected.

Namely, by performing the processes at the steps S106 to S114, the binary data DM sequentially selects the respective columns j=0, 1, 2, 3, 4, while the binary data DL selects the first row i=0 on the respective columns j=0, 1, 2, 3, 4 selected in the above mentioned order. In this manner, the first row i=0 on either one of the column j is selected, and the operational flow proceeds to a step S116.

Then, the bit decoder 15 decodes the binary data DL and supplies the select data DBT, which is the result of the decoding, to the bit selector 17 (step S116).

Then, the address decoder 14 decodes the binary data DM, and transmits the address data DADR, which is the result of decoding, to the CPU 1, so that the CPU 1 obtains the address data DADR (step S118).

Next, the CPU 1 memory-accesses the memory unit 2 on the basis of the obtained address data DADR, and reads out the original data of the $2^n=8$ bits stored in the memory area at the address r indicated by the address data DADR, to thereby load it to the data register 16 (step S120).

For example, in case that the process at the step S120 is firstly performed, since the value of the binary data DM of the presettable counter 13 becomes "0", the value of the address data DADR also becomes "0". Thus, the bit sequence of {C0, C1, C2, C3, C4, C5, C6, C7}={0, 1, 0, 1, 1, 0, 1, 0} in the memory area D0 corresponding to the address r=0 shown in FIG. 6C is stored into the data register 16.

Then, the bit selector 17 closes the switching element for only one bit indicated by the select data DBT. By this, only the bit indicated by the select data DBT is outputted among the data DLD in the data register 16.

For example, in case that the process at the step S122 is firstly performed, since the value of the binary data DL of the presettable counter 13 becomes "0", the switching element Sn−1 becomes in the closed condition in FIG. 2, by the select data DBT, so that the MSB of the bit sequence of {0, 1, 0, 1, 1, 0, 1, 0} i.e., the first bit "0" from the left side is outputted. Namely, the bit data C0=0 at the bit $A_{0,7}$ shown in FIGS. 6A and 6C becomes the output data Dout of first bit which is interleaved.

Then, the adder 12 adds the column specifying data Dj of the column register 9 and the counted data Dx of the presettable counter 13, and presets the addition data DAD (=Dj+Dx) to the presettable counter 13 again.

For example, in case that the process at the step S124 is firstly performed, since the value of the column specifying data Dj is "5" and the value of the counted data Dx is "0", the value of the addition data DAD becomes "5". Thus, the value "5" is preset to the presettable counter 13. As a result, the value of the binary data DL of the presettable counter 13 becomes "5" and the value of the binary data DM is kept to be "0" as it is. Accordingly, the bit data C5=0 at the bit $A_{0,2}$ shown in FIGS. 6A and 6C is selected.

Next, the row counted data Dic of the row counter 8 is incremented (Step S126). Then, the processes from the step S112 are repeated.

For example, in case that the process at the step S126 is firstly performed, the value of the row counted data Dic becomes "1". After the row i=2 shown in FIG. 6B is specified, the processes from the step S112 are repeated.

In this way, when the processes at the steps S116 to S126 are performed at the first time, as the respective data Di, Dic, Dj, Djc, Dx, DL, DM, DADR and DBT change as shown in FIG. 8A, the bit data C0=0 of the original data Din becomes the first output data Dout.

Then, when the process at the step S112 is again performed i.e., at the second time), since the condition is still as Dic<Di, the processes at the steps S116 to S126 are performed (at the second time).

In this processes at the second time, since the value of the binary data DM of the presettable counter 13 becomes "0", the bit sequence of {C0, C1, C2, C3, C4, C5, C6, C7}={0, 1, 0, 1, 1, 0, 1, 0} stored in the memory are D0 corresponding to the address r=0 shown in FIG. 6C is loaded into the data register 16 in the memory area D0 corresponding to the address r=0 shown in FIG. 6C. Further, since the value of the binary data DL of the presettable counter 13 becomes "5", the bit data C5=0 is outputted. Namely, by the processes at the second time, the bit data C5=0 at the bit $A_{0,2}$ shown in FIGS. 6A and 6B becomes the output data Dout of the second bit which is interleaved.

In this way, when the processes at the steps S116 to S126 are performed at the second time, as the respective data Di, Dic, Dj, Djc, Dx, DL, DM, DADR and DBT change as shown in FIG. 8B, the bit data C5=0 of the original data Din becomes the second output data Dout. Then, at the step S126, the row counted data Dic of the row counter 8 is incremented again at the step S126, and the processes from the step S112 are repeated.

In this manner, when the processes at the steps S116 to S126 are repeated 6 times, the bit sequence of {C0, C5, C10, C15, C20}={0, 0, 1, 1, 0, 0} corresponding to the column j=0 shown in FIG. 6B becomes the output data Dout of the bit which is interleaved.

Then, when the processes at the $6^{th}$ time are completed, since Dic≧Di at the step S112, the column j=1 is set at the step S114. Further, after the row i=0 is set at the step S110, the processes at the steps S116 to S126 are repeated 6 times. Namely, the bit sequence of {C1, C6, C11, C16, C21}={1, 1, 0, 0, 0, 0} corresponding to the column j=1 shown in FIG. 6B becomes the output data Dout of the bit which is interleaved.

After that, in the same manner as mentioned above, the processes at the steps S106 to S126 are repeated, the remaining bit sequence corresponding to the column j=2, 3, 4 as shown in FIG. 6B becomes the output data Dout of the bit which is interleaved.

Then, at the step S106, if it is judged that all the data Din are interleaved (step S106: NO), the processes are ended.

In this manner, according to the present embodiment, it is possible to interleave the original data Din by using the memory unit 2 for storing the data of $2^n$ bits in each memory area thereof. Thus, it is possible to realize a code error correcting circuit suitable for the microcomputer system. Further, since the memory unit 2 for storing the data of $2^n$ bits in each memory area thereof is used, it is possible for the CPU 1 to reduce the number of time of memory-accessing the memory unit 2. By this, it is possible to reduce the burden on the CPU 1 and also shorten the time duration required for interleaving.

When transmitting the output data Dout, which is interleaved as shown in the middle stage of FIG. 3 by a communicating apparatus, even if code errors are continuously generated at positions indicated by reference signs * * * *, these code errors are dispersed after de-interleaving the output data Dout to the data Dt as shown in the bottom stage of FIG. 3. Accordingly, it is possible to easily correct the code errors. In the present embodiment, it is possible to obtain the guard space having the 4 bits length.

In the present embodiment, the memory unit 2 has the 8 bits/word structure. However, the present invention is not limited to this. Namely, the memory unit 2 may have a $2^n$ bits/word structure.

In the present embodiment, the original data Din in which one block has the 30 bits length is interleaved. However, the present invention is not limited to this. It is possible to interleave the original data in which one block has a bit sequence of an arbitrary number of bits, in the present invention.

In the present embodiment, the bit sequence of the original data Din are arranged in the matrix of 6 rows and 5 columns as shown in FIG. 6B, and the bits are read out therefrom in the predetermined order. However, the present invention is not limited to this matrix of 6 rows and 5 columns. It is possible to perform interleaving with arranging the original data Din in a matrix of arbitrary rows and arbitrary columns, and reading out the bits therefrom in a predetermined order.

In the present embodiment, the operation timings in the code error correcting circuit ECT are controlled in accordance with the instructions from the CPU 1. However, the present invention is not limited to this. For example, it is possible to constitute a timing controlling circuit by means of a hardware, separately from the CPU 1. Then, it is possible to reduce the burden on the CPU 1 by controlling the operation timings of the constitutional elements of the code error correcting circuit ECT such as operation controls for the comparators 7 and 10, counting controls for the row counter 8 and the column counter 11, the data settings for the row register 6 and the column register 9 and so on, under the control of such a timing controlling circuit.

The above described code error correcting circuit ECT of the present embodiment may be applied to various types of electronic apparatuses.

Figure 9:
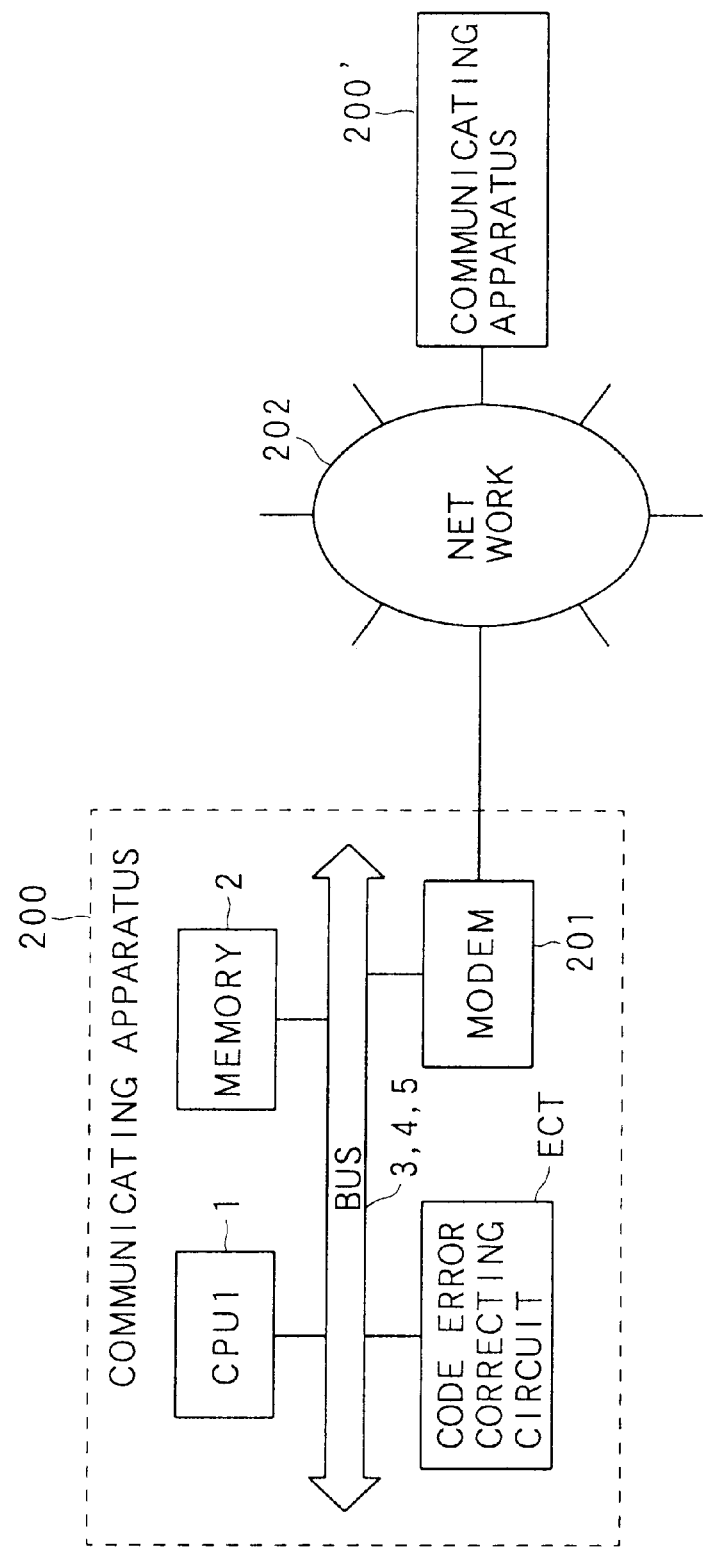
FIG. 9 is a block diagram showing a communicating apparatus as another embodiment of the present invention.

For example, as shown in FIG. 9, the above described code error correcting circuit ECT as well as the CPU 1 and the memory unit 2 may be included in a communicating apparatus 200, for example. The communicating apparatus 200 also includes a modem 201 connected to the control bus 3, the address bus 4 and the data bus 5. Thus, the communicating apparatus 200 may transmit the output data Dout, which is interleaved by the code error correcting circuit ECT, as the interleaved transmission data by the modem 201 onto a network 202 through a wire or wireless communication. The transmitted output data Dout may be received by a communicating apparatus 200' on the other party, and may be de-interleaved by another code error correcting circuit ECT in the communicating apparatus 200', which has a similar or same structure as the communicating apparatus 200. Alternatively, the communicating apparatus 200 may receive the output data Dout, which is interleaved by another code error correcting circuit provided in the communicating apparatus 200', through the network 202, and de-interleaves the received output data Dout by the code error correcting circuit ECT.

Further, the above described code error correcting circuit ECT of the present embodiment may be included in an information recording and/or reproducing apparatus such as a DVD player, a DVD recorder, a CD player, a CD recorder or the like.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-256960 filed on Sep. 10, 1999 including the specification, claims, drawings and summary is incorporated herein by reference in its entirety.

What is claimed is:

1. A code error correcting circuit for interleaving original data comprising a sequence of bit data having a length of p bits (p: natural number) by arranging the bit data of the original data into a hypothetical matrix of I (I: natural number not less than 2) rows and J (J: natural number not less than 2) columns and then selecting the bit data positioned on the $i^{th}$ (i: natural number, $1 \leq i \leq I$) row along an order of the $j^{th}$ (j: natural number, $1 \leq j \leq J$) column, said code error correcting circuit comprising:

a memory unit having a plurality of memory areas each having a length of $2^n$ bits (n: natural number);

a controller for storing the original data to be interleaved into the memory areas respectively;

a first data generating device for generating a first data indicating a position of the $i^{th}$ row in the hypothetical matrix;

a second data generating device for generating a second data indicating a position of the $j^{th}$ column in the hypothetical matrix;

an address decoding device for generating address data indicating one of the memory areas, in which the bit data positioned on the $j^{th}$ column are stored, on the basis of the first data and the second data; and a select data decoding device for generating a bit select data indicating the bit data positioned on the $i^{th}$ row among the bit data stored in said one of the memory areas, which is indicated by the address data, on the basis of the first data and the second data, said controller controlling said first data generating device, said second data generating device, said address decoding device and said select data decoding device so that the bit data, which are indicated by the bit select data, stored in said memory unit are sequentially outputted along an order of the $i^{th}$ row and the $j^{th}$ column in the hypothetical matrix as the interleaved original data.

2. A code error correcting circuit according to claim 1, further comprising:

a data holding device for holding the sequence of the bit data having a length of $2^n$ bits, which are read out from the memory area corresponding to the address data; and a bit selecting device for selecting the bit data indicated by the bit select data from among the sequence of the bit data having the length of $2^n$ bits held by said data holding device, and outputting the selected bit data as the interleaved data.

3. A code error correcting method of interleaving original data comprising a sequence of bit data having a length of p bits (p: natural number) by arranging the bit data of the original data into a hypothetical matrix of I (I: natural number not less than 2) rows and J (J: natural number not less than 2) columns and then selecting the bit data positioned on the $i^{th}$ (i: natural number, $1 \leq i \leq I$) row along an order of the $j^{th}$ (j: natural number, $1 \leq j \leq J$) column, said code error correcting method comprising:

a controlling process of storing the original data to be interleaved into a plurality of memory areas each having a length of $2^n$ bits (n: natural number) of a memory unit respectively;

a first data generating process of generating a first data indicating a position of the $i^{th}$ row in the hypothetical matrix;

a second data generating process of generating a second data indicating a position of the $j^{th}$ column in the hypothetical matrix;

an address decoding process of generating address data indicating one of the memory areas, in which the bit data positioned on the $j^{th}$ column are stored, on the basis of the first data and the second data;

a select data decoding process of generating a bit select data indicating the bit data positioned on the $i^{th}$ row among the bit data stored in said one of the memory areas, which is indicated by the address data, on the basis of the first data and the second data; and an outputting process of outputting the bit data, which are indicated by the bit select data, stored in said memory unit sequentially along an order of the $i^{th}$ row and the $j^{th}$ column in the hypothetical matrix as the interleaved original data.

4. A code error correcting method according to claim 3, further comprising:

a data holding process of holding the sequence of the bit data having a length of $2^n$ bits, which are read out from the memory area corresponding to the address data; and a bit selecting process of selecting the bit data indicated by the bit select data from among the sequence of the bit data having the length of $2^n$ bits held by said data holding process, and outputting the selected bit data as the interleaved data.

5. A communicating apparatus comprising (i) a code error correcting circuit for interleaving original data comprising a sequence of bit data having a length of p bits (p: natural number) by arranging the bit data of the original data into a hypothetical matrix of I (I: natural number not less than 2) rows and J (J: natural number not less than 2) columns and then selecting the bit data positioned on the $i^{th}$ (i: natural number, $1 \leq i \leq I$) row along an order of the $j^{th}$ (j: natural number, $1 \leq j \leq J$) column, said code error correcting circuit comprising:

a memory unit having a plurality of memory areas each having a length of $2^n$ bits (n: natural number);

a controller for storing the original data to be interleaved into the memory areas respectively;

a first data generating device for generating a first data indicating a position of the $i^{th}$ row in the hypothetical matrix;

a second data generating device for generating a second data indicating a position of the $j^{th}$ column in the hypothetical matrix; an address decoding device for generating address data indicating one of the memory areas, in which the bit data positioned on the $j^{th}$ column are stored, on the basis of the first data and the second data; and a select data decoding device for generating a bit select data indicating the bit data positioned on the $i^{th}$ row among the bit data stored in said one of the memory areas, which is indicated by the address data, on the basis of the first data and the second data, said controller controlling said first data generating device, said second data generating device, said address decoding device and said select data decoding device so that the bit data, which are indicated by the bit select data, stored in said memory unit are sequentially outputted along an order of the $i^{th}$ row and the $j^{th}$ column in the hypothetical matrix as the interleaved original data, and (ii) a transmitting device for transmitting the interleaved original data.

6. A communicating method comprising (i) a code error correcting method of interleaving original data comprising a sequence of bit data having a length of p bits (p: natural number) by arranging the bit data of the original data into a hypothetical matrix of I (I: natural number not less than 2) rows and J (J: natural number not less than 2) columns and then selecting the bit data positioned on the $i^{th}$ (i: natural number, $1 \leq i \leq I$) row along an order of the $j^{th}$ (j: natural number, $1 \leq j \leq J$) column, said code error correcting method comprising:

a controlling process of storing the original data to be interleaved into a plurality of memory areas each having a length of $2^n$ bits (n: natural number) of a memory unit respectively;

a first data generating process of generating a first data indicating a position of the $i^{th}$ row in the hypothetical matrix;

a second data generating process of generating a second data indicating a position of the $j^{th}$ column in the hypothetical matrix;

an address decoding process of generating address data indicating one of the memory areas, in which the bit data positioned on the $j^{th}$ column are stored, on the basis of the first data and the second data;

a select data decoding process of generating a bit select data indicating the bit data positioned on the $i^{th}$ row among the bit data stored in said one of the memory areas, which is indicated by the address data, on the basis of the first data and the second data; and an outputting process of outputting the bit data, which are indicated by the bit select data, stored in said memory unit sequentially along an order of the $i^{th}$ row and the $j^{th}$ column in the hypothetical matrix as the interleaved original data, and (ii) a transmitting process of transmitting the interleaved original data.

* * * * *